(12) United States Patent
Balakrishnan et al.

(10) Patent No.: US 9,000,530 B2
(45) Date of Patent: Apr. 7, 2015

(54) 6T SRAM ARCHITECTURE FOR GATE-ALL-AROUND NANOWIRE DEVICES

(71) Applicant: International Business Machines Corporation, Armonk, NY (US)

(72) Inventors: Karthik Balakrishnan, New York, NY (US); Josephine B. Chang, Mahopac, NY (US); Paul Chang, Mathopac, NY (US); Michael A. Guillorn, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 13/868,626

(22) Filed: Apr. 23, 2013

(65) Prior Publication Data

US 2014/0312426 A1    Oct. 23, 2014

(51) Int. Cl.

| | |
|---|---|
| *H01L 21/70* | (2006.01) |
| *H01L 29/06* | (2006.01) |
| *H01L 27/092* | (2006.01) |
| *H01L 21/84* | (2006.01) |
| *H01L 29/423* | (2006.01) |
| *H01L 27/11* | (2006.01) |
| *H01L 27/12* | (2006.01) |
| *H01L 21/8238* | (2006.01) |

(52) U.S. Cl.
CPC .......... *H01L 29/0673* (2013.01); *H01L 27/092* (2013.01); *H01L 21/84* (2013.01); *H01L 29/42392* (2013.01); *H01L 27/1108* (2013.01); *H01L 27/1203* (2013.01)

(58) Field of Classification Search
None
See application file for complete search history.

(56) References Cited

U.S. PATENT DOCUMENTS

| | | |
|---|---|---|
| 7,598,544 B2 | 10/2009 | Bertin et al. |
| 7,619,562 B2 | 11/2009 | Stumbo et al. |
| 8,018,007 B2 | 9/2011 | Chang et al. |
| 8,110,458 B2 | 2/2012 | Jin et al. |
| 8,183,104 B2 | 5/2012 | Hobbs et al. |
| 8,203,148 B2 | 6/2012 | Sekar et al. |

(Continued)

OTHER PUBLICATIONS

Mann, R.W.; Calhoun, B.H., "New category of ultra-thin notchless 6T SRAM cell layout topologies for sub-22nm," Quality Electronic Design (ISQED), 2011 12th International Symposium on , vol., no., pp. 1,6, Mar. 14-16, 2011.

(Continued)

*Primary Examiner* — Calvin Choi

(74) *Attorney, Agent, or Firm* — Harrington & Smith; Louis J. Percello

(57) ABSTRACT

A memory device includes a first plurality of semiconductor nanowires tethered between landing pads and suspended over a substrate. A first gate electrode surrounds each of the first plurality of semiconductor nanowires, making them gate-all-around (GAA) semiconductor nanowires. First, second, and third field effect transistors (FETs) are formed by the first plurality of semiconductor nanowires. The memory device also includes a second plurality of semiconductor nanowires tethered between landing pads and suspended over the substrate. A second gate electrode surrounds each of the second plurality of semiconductor nanowires, making them GAA semiconductor nanowires. Fourth, fifth, and sixth FETs are formed by the second plurality of semiconductor nanowires. The first gate electrode is aligned with and cross-coupled to a landing pad of the second plurality of semiconductor nanowires, and the second gate electrode is aligned with and cross-coupled to a landing pad of the first plurality of semiconductor nanowires.

14 Claims, 5 Drawing Sheets

(56) References Cited

U.S. PATENT DOCUMENTS

| | | | |
|---|---|---|---|
| 8,216,951 | B2 | 7/2012 | Cheng et al. |
| 2010/0207208 | A1* | 8/2010 | Bedell et al. ............ 257/346 |
| 2010/0314692 | A1* | 12/2010 | Miyashita ................ 257/393 |
| 2011/0031473 | A1 | 2/2011 | Chang et al. |
| 2011/0156004 | A1 | 6/2011 | Radosavljevic et al. |
| 2011/0249489 | A1* | 10/2011 | Bangsaruntip et al. ...... 365/156 |
| 2011/0272673 | A1 | 11/2011 | Bangsaruntip et al. |

OTHER PUBLICATIONS

Mann, Randy. "Optimized 6T SRAM cell topology for sub-20nm," (Cell concept origination based on Ph. D. thesis while) at UVA with Prof, Calhoun), Dec. 16, 2010 (19 pages).

S. Bangsaruntip, et al. High Performance and Highly Uniform Gate-All-Around Silicon Nanowire MOSFETs with Wire Size Dependent Scaling; 2009 IEEE (4 pages).

S. Bangsaruntip, et al. Gate-all-around Silicon Nanowire 25-Stage CMOS Ring Oscillators with Diameter Down to 3 nm; 2010 Symposium on VLSI Technology Digest of Technical Papers, IEEE (2 pages).

V. S. Basker, et al.; A 0.063 μm2 FinFET SRAM cell demonstration with conventional lithography using a novel integration scheme with aggressively scaled fin and gate pitch; 2010 Symposium on VLSI Technology Digest of Technical Papers IEEE (2 pages).

H. Kawasaki, et al.; Demonstration of Highly Scaled FinFET SRAM Cells with High-κ /Metal Gate and Investigation of Characteristic Variability for the 32 nm node and beyond; 2008 IEEE (4 pages).

Eric Karl, et al.; A 4.6GHz 162Mb SRAM Design in 22nm Tri-Gate CMOS Technology with Integrated Active VMIN-Enhancing Assist Circuitry; ISSCC 2012 / SESSION 13 / High-Performance Embedded SRAM / 13.1-2012 IEEE International Solid-State Circuits Conference (3 pages).

J. W. Sleight, et al.; Gate-All-Around Silicon Nanowire MOSFETs and Circuits; Dec. 2010. IEEE (4 pages).

* cited by examiner

6T SRAM ARCHITECTURE FOR GATE-ALL-AROUND NANOWIRE DEVICES

TECHNICAL FIELD

This disclosure relates to semiconductor nanowire field effect transistors and to memory devices formed therefrom.

BACKGROUND

The six transistor (6T) static random access memory (SRAM) cell is the primary memory used in microprocessor circuits. As is well known to those of ordinary skill in the art, continued efforts are being made to design integrated circuit chips having the greatest possible number of individual 6T SRAM cells, in order to provide the integrated circuit chip with as much memory as possible within the available area thereon. To achieve this goal, integrated circuit designers have been developing layouts for the transistors making up the cells to reduce the area required for each. The present invention provides one approach toward meeting this challenge.

SUMMARY

In one aspect of the present invention, a memory device comprises a first plurality of semiconductor nanowires tethered between landing pads and suspended over a substrate. A first gate electrode is disposed on the first plurality of semiconductor nanowires. Each of the first plurality of semiconductor nanowires is surrounded by the first gate electrode, the semiconductor nanowires of the first plurality thereby being gate-all-around (GAA) semiconductor nanowires.

A first, a second, and a third field effect transistor (FET) are each formed, with the first gate electrode, by at least one of the first plurality of semiconductor nanowires. The first, second, and third FETs each have a source/drain contact.

The memory device also comprises a second plurality of semiconductor nanowires tethered between landing pads and suspended over the substrate. A second gate electrode is disposed on the second plurality of semiconductor nanowires. Each of the second plurality of semiconductor nanowires is surrounded by the second gate electrode, the semiconductor nanowires of the second plurality thereby being GAA semiconductor nanowires.

A fourth, a fifth, and a sixth FET are each formed, with the second gate electrode, by at least one of the second plurality of semiconductor nanowires. The fourth, fifth, and sixth FETs each have a source/drain contact.

The first gate electrode is aligned with and cross-coupled to a landing pad of the second plurality of semiconductor nanowires, and the second gate electrode is aligned with and cross-coupled to a landing pad of the first plurality of semiconductor nanowires. The first and second gate electrodes each have a gate contact.

The source/drain contact of the first FET is connected to a bitline connection; the source/drain contacts of the second and fifth FETs are each connected to ground connections; the source/drain contacts of the third and fourth FETs are each connected to operating voltage connections; the source/drain contact of the sixth FET is connected to a bitline bar connection; and the gate contacts of the first and second gate electrodes are connected to a word line connection.

In another aspect of the present invention, a method for forming a memory device includes forming a first plurality of semiconductor nanowires tethered between landing pads and suspended over a substrate; forming a first gate electrode on the first plurality of semiconductor nanowires, each of the first plurality of semiconductor nanowires being surrounded by the first gate electrode; forming a first a second, and a third field effect transistor (FET) with the first gate electrode, each with at least one of the first plurality of semiconductor nanowires; and forming a source/drain contact for each of the first, second, and third FETs.

The method for forming a memory device also includes forming a second plurality of semiconductor nanowires tethered between landing pads and suspended over the substrate, wherein one of the landing pads is aligned with the first gate electrode; forming a second gate electrode on the second plurality of semiconductor nanowires, wherein the second gate electrode is aligned with one of the landing pads of the first plurality of semiconductor nanowires, each of the second plurality of semiconductor nanowires being surrounded by the second gate electrode; forming a fourth, a fifth, and a sixth field effect transistor (FET) with the second gate electrode, each with at least one of the second plurality of semiconductor nanowires; and forming a source/drain contact for each of the fourth, fifth, and sixth FETs.

The method for forming a memory device further includes coupling the first gate electrode to the landing pad of the second plurality of semiconductor nanowires; coupling the second gate electrode to the landing pad of the first plurality of semiconductor nanowires; and forming a gate contact on each of the first and second gate electrodes.

The method for forming a memory device finally includes connecting the source/drain contact of the first FET to a bitline connection; connecting the source/drain contacts of the second and fifth FETs to ground connections; connecting the source/drain contacts of the third and fourth FETs to operating voltage connections; connecting the source/drain contact of the sixth FET to a bitline bar connection; and connecting the gate contacts of the first and second gate electrodes to a word line connection.

BRIEF DESCRIPTION OF THE DRAWINGS

The foregoing and other aspects of these teachings are made more evident in the following detailed description, when read in conjunction with the attached drawing figures.

DETAILED DESCRIPTION

An integrated circuit may include a number of different types of field effect transistor (FET) devices that may be formed from nanowire channel FETs. A nanowire channel FET includes a silicon nanowire that connects to a source region and a drain region and a gate that fully (or partially) surrounds the nanowire or nanowires. The channel forms at the surface of the nanowires under the gate, or in the bulk of the nanowires for nanowires with diameter smaller than about 5 nm. When the gate fully surrounds the nanowire, the device is referred to as a gate-all-around (GAA) FET. When the gate partially surrounds the nanowire, as in the case where the nanowire is attached to an insulator, the device is referred to as an omega-gate FET.

Nanowire FETs may be fabricated to form, for example, nFET and pFET devices. The nFET and pFET devices may be connected to form a variety of integrated circuit devices such as, for example, inverters and static random access memory (SRAM) cells. It is generally desirable in circuit devices for FETs to be matched by having, for example, similar threshold voltages and drive current.

Nanowire FET devices that are formed on a wafer may include any number of nanowires. The fabrication process may include, for example, forming a silicon nanowire on a buried oxide (BOX) substrate using an isotropic etching process. The etching process results in an elliptically (including cylindrically) shaped nanowire that may be suspended above the substrate or may be partially disposed on the substrate. A metallic or polysilicon gate structure is formed on the nanowire. Source and drain regions are formed adjacent to the gate structure, and contacts may be formed to connect the source, drain, and gate structure to other devices.

The fabrication process may result in particular nanowires having different properties such as, for example, the diameter of one nanowire on a wafer may be different from the diameter of another nanowire due to the location of the particular nanowire on the wafer. Though the diameters of two different nanowires may vary on a wafer, the diameter of each particular nanowire is typically constant, and within a desired tolerance.

Integrated circuit components, such as, for example, SRAM cells and inverters, include a number of pFET and nFET devices disposed on nanowires that are arranged on a wafer. Since the properties of the nanowires (e.g., nanowire diameters) affect the operation of the devices, it is desirable to arrange the devices such that the effects of the differences in the nanowire properties are reduced.

Figure 1:
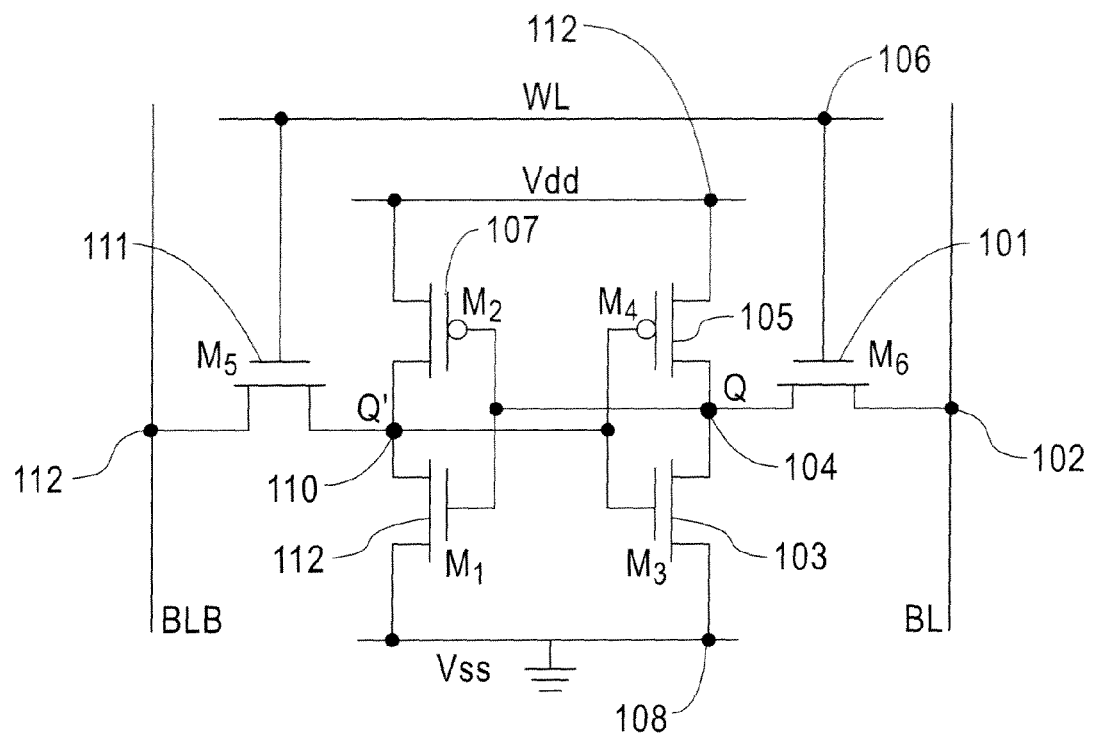
FIG. 1 is a circuit diagram of a static random access memory (SRAM).

FIG. 1 is a circuit diagram of a static random access memory (SRAM). The SRAM includes a first nFET device ($M_6$) 101 connected to a first bit line node (BL) 102, a first output node (Q) 104, and a word line node (WL) 106. A second nFET device ($M_3$) 103 is connected to the Q node 104, a ground node (Vss) 108, and a second output node (Q') 110. A first pFET device ($M_4$) 105 is connected to the Q node 104, the Q' node 110, and a voltage source node (Vdd) 112. A second pFET device ($M_2$) 107 is connected to the Vdd node 112, the Q node 104, and the Q' node 110. A third nFET device ($M_1$) 109 is connected to the Vss node 108, the Q node 104, and the Q' node 110. A fourth nFET device ($M_5$) 111 is connected to a second bit line node (BLB) 112, the WL node 106, and the Q' node 110. The first and fourth nFET devices, $M_6$ and $M_5$, respectively, are the pass-gate transistors of the SRAM; the second and third nFET devices, $M_3$ and $M_1$, respectively, are the pull-down transistors of the SRAM; and the first and second pFET devices, $M_4$ and $M_2$, respectively, are the pull-up transistors of the SRAM.

As discussed above, the nanowires on a wafer may have different diameters that affect the performance characteristics of the gates disposed on the nanowires. The performance of integrated circuits including, for example, the SRAM circuit of FIG. 1, may be improved when particular FETs in the devices have similar characteristics. Thus, for example, designing integrated circuits such that particular FETs share a common nanowire may improve the performance of the circuits through the use of better matched devices in the commonwire.

Figure 2:
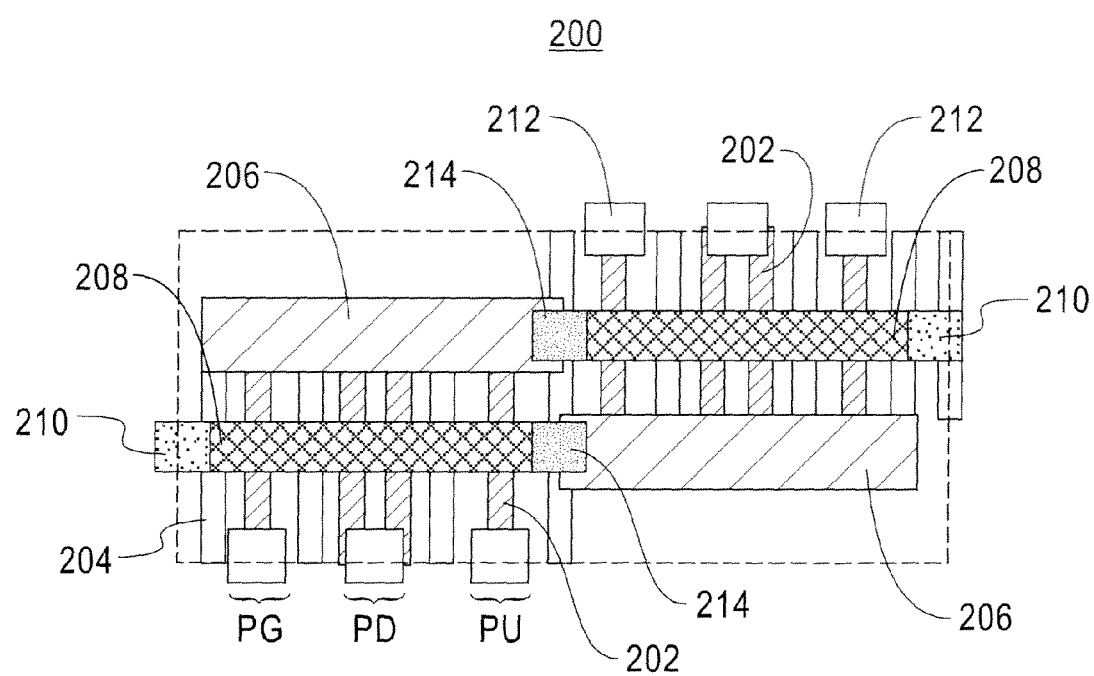
FIG. 2 is a plan view of one cell of the 6T SRAM GAA nanowire (NW) device of the present invention.

FIG. 2 is a plan view of one cell 200 of the 6T SRAM GAA NW device of the present invention. The cell 200 comprises eight active fins 202 and eight dummy fins 204, all of which are silicon nanowires tethered at each end by SOI (silicon on insulator) landing pads 206. It may be noted that active fins 202 and dummy fins 204 appear to be tethered at only one end by landing pads 206. As will be seen below, each of the fins ends to a second landing pad 206 which is outside of cell 200, and belongs to an adjacent cell.

The dummy fins 204 are included in FIG. 2 for purposes of illustration, and are not present in the device of the present invention. The silicon nanowires are suspended over the silicon wafer on which they are constructed before the formation of gate electrodes 208, which, because they surround the nanowires passing through them, are referred to as gate-all-around (GAA) devices. In practice, the nanowires are embedded in an insulating material, such as silicon nitride, after the gate electrodes 208 have been formed Cell 200 has a PU (pull up)-PG (pass gate)-PD (pull down) ratio of 1-1-2. Referring to FIG. 2, the PU and PG transistors are each formed on one active fin 202; while the PD transistors are formed on two adjacent active fins 202. Thus, the ratio is 1-1-2. Cells having other ratios may be constructed, and the use of different numbers of nanowires or fins to form the transistors provides a good way to ratio the transistors making up cell 200. For example, a cell having a PU (pull up)-PG (pass gate)-PD (pull down) ratio of 1-2-2 may be constructed where the PU transistors are formed on one active fin 202, while the PG and PD transistors are each formed on two adjacent active fins 202. Dummy fins 204 which are not used in a particular design are ultimately removed during the manufacturing process. Gate electrodes 208 have gate contacts 210 at one end.

Cell 200, then, has sixteen fins (or nanowires) 202, 204 with single wire breaks, except the break for gate contacts 210. The cell height for cell 200 is 1.5 CPP (contacted polysilicon pitch). Active fins 202 are doped as necessary, so that, together with gate electrodes 208, they form the pFETs and nFETs required to make up a 6T SRAM cell. Specifically, as was noted above, PU transistors are pFETs, while PG and PD transistors are nFETs.

Source/drain contacts 212 are disposed along the active fins 202 at the boundary of the cell 200. In addition, bridge contacts 214, which are a cross couple between landing pads 206 and gate electrodes 208, are located at the other end of the gate electrodes 208 from the gate contacts 210 to form cross connections with the landing pads 206 for the other active fins 202 in the cell 200. Bridge contacts 214 eliminate the spacer at the end of the gate electrodes 208 to create an epitaxial cross couple during the epitaxial raised source/drain growth module. It will be noted that cell 200 is thin in the vertical direction of FIG. 2, in contrast to cell designs of the prior art, because the landing pad 206 for one inverter, that is, the three transistors on the left side of the cell 200, lines up with the gate electrode 208 for the other inverter, that is, the three transistors on the right side of the cell 200, and vice versa. This ultra-thin cell design enables a greater number of such cells to be included in an integrated circuit of fixed physical dimensions.

Figure 3:
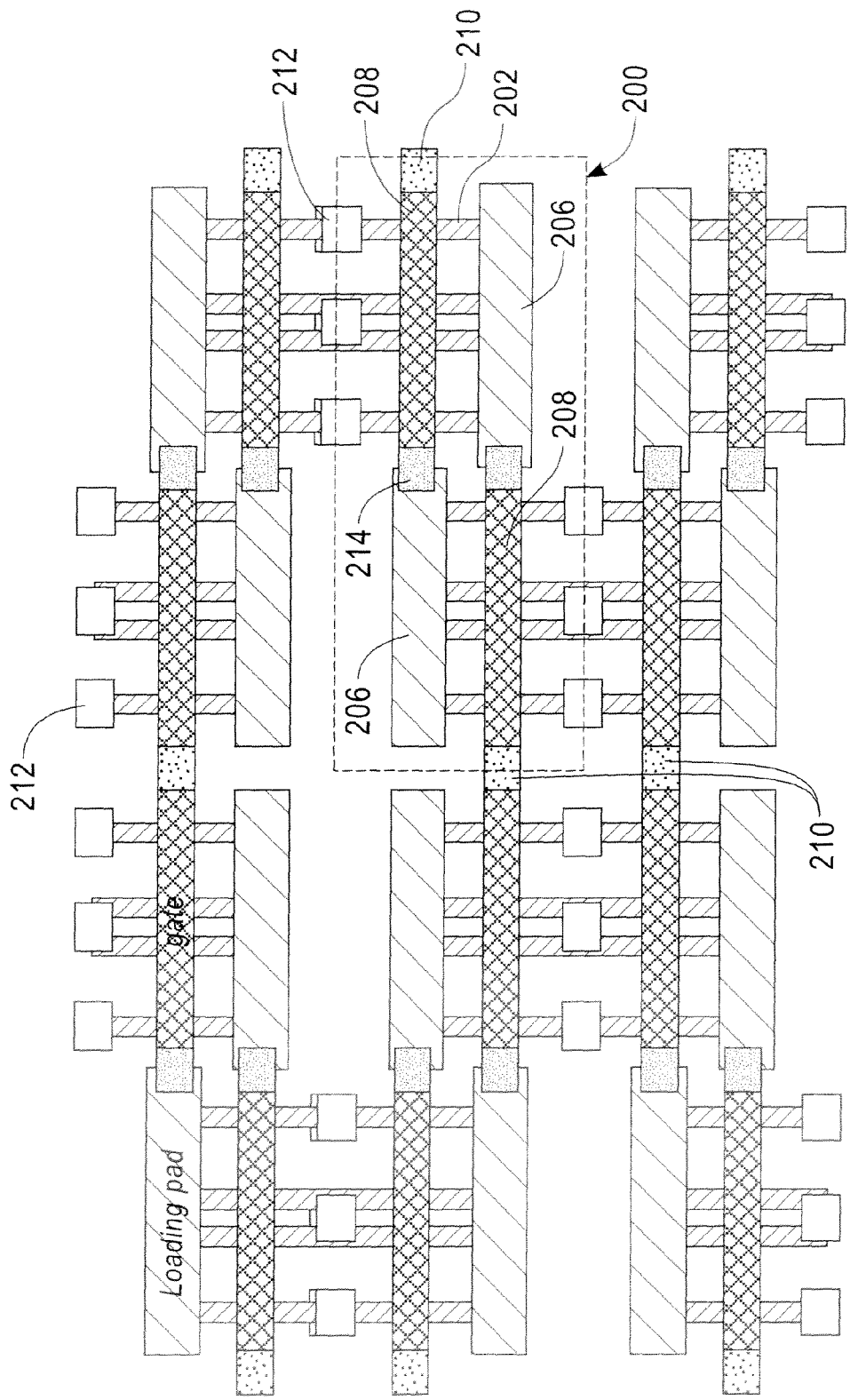
FIG. 3 is a plan view showing the connection of cell of FIG. 1 to other cells of the same in integrated circuit including a plurality of such cells.

FIG. 3 is a plan view showing the connection of cell 200 to other cells of the same type in an integrated circuit including a plurality of such cells 200. Cell 200 is within the dashed-line rectangle in FIG. 3, and is the same as that shown in FIG. 2, except that dummy fins 204 have been omitted for the sake of clarity. As indicated above, active fins 202 extend between a pair of landing pads 206 in neighboring cells 200.

Gate contacts 210 and source/drain contacts 212 and are elevated over landing pads 206 and gate electrodes 208, that is to say, gate contacts 210 and source/drain contacts 212 extend above the planes formed by the landing pads 206 and the gate electrodes 208. In practice, the structure shown in FIG. 3 is embedded in an insulating material through which the gate contacts 210 and source/drain contacts 212 extend.

Figure 4:
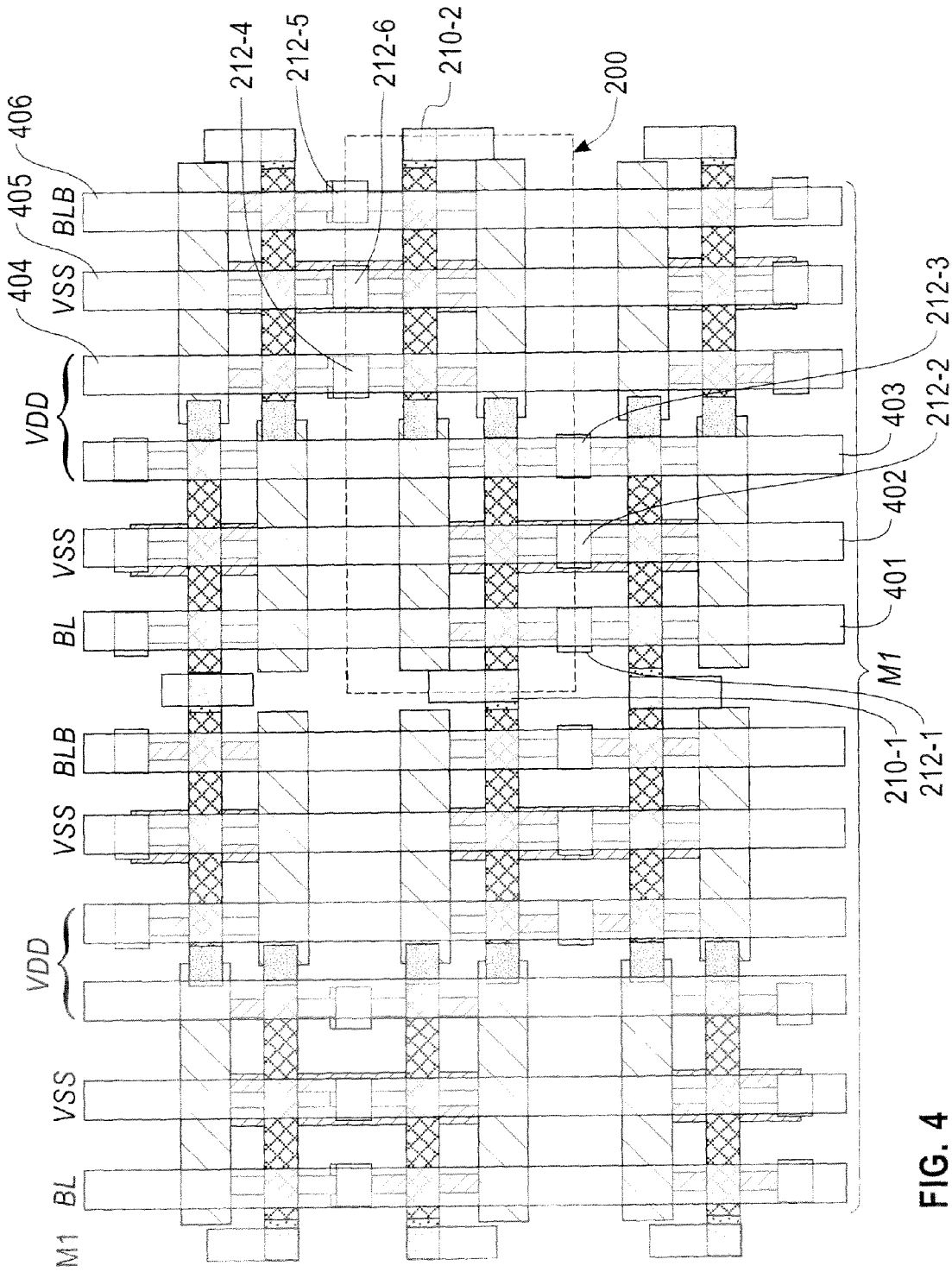
FIG. 4 is a plan view showing a first metal connection layer above the cells shown in FIG. 3.

FIG. 4 is a plan view showing a first metal connection layer (M1) above the cells 200 shown in FIG. 3. In FIG. 4, strips of a metallic conductor have been deposited onto the structure shown in FIG. 3 to form the electrical connections for each cell. With particular focus on cell 200 in FIG. 4, bitline (BL) connection 401 connects to source/drain contact 212-1 for a pass-gate transistor. Ground (VSS) connection 402 connects to source/drain contact 212-2 for a pull-down transistor. Operating voltage (VDD) connection 403 connects to source/drain contact 212-3 for a pull-up transistor.

Further, operating voltage (VDD) connection 404 connects to source/drain contact 212-4 for a second pull-up transistor. Ground (VSS) connection 405 connects to source/drain contact 212-5 for a second pull-down transistor. And, finally, bitline bar (BLB) connection 406 connects to source/drain contact 212-6 for a second pass-gate transistor. In addition, rectangular gate contact elements 210-1 and 210-2 are provided on the gate contacts 210 at opposite ends of the cell 200 at the same level as connections 401, 402, 403, 404, 405, and 406.

Subsequently, gate contact elements 210-1 and 210-2 are built up above the level of connections 401, 402, 403, 404, 405, and 406 to extend above the plane formed by connections 401, 402, 403, 404, 405, and 406. In practice, the structure shown in FIG. 4 is embedded in an insulating material through which the gate contact elements 210-1 and 210-2 extend. Finally, bridge contacts 214 do not come into contact with the operating voltage (VDD) connections 403, 404 on either side of them, as they are below the plane formed by the source/drain contacts 212.

Figure 5:
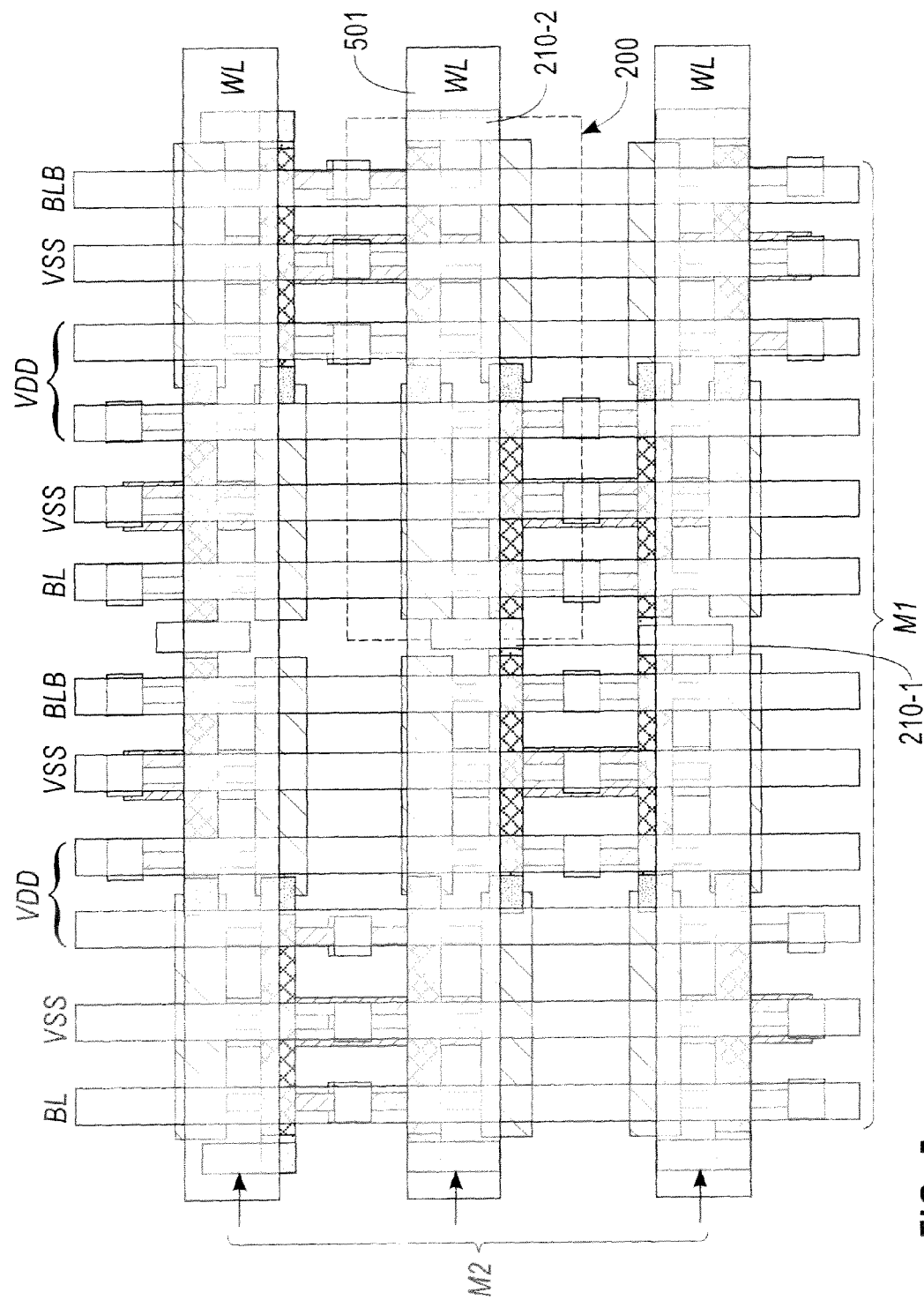
FIG. 5 is a plan view showing a second metal connection layer above the cells shown in FIG. 4.

FIG. 5 is a plan view showing a second metal connection layer (M2) above the cells 200 shown in FIG. 4. In FIG. 5, strips of a metallic conductor have been deposited onto the structure shown in FIG. 4 to complete the electrical connections for each cell. With particular focus on cell 200 in FIG. 5, word line connection 501 connects to gate-contacts 210-1 and 210-2 at opposite ends of cell 200. As may be seen in FIG. 5, a completely wired SRAM array requires only two levels of metal, M1 and M2.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various modifications and adaptations may become apparent to those skilled in the relevant arts in view of the foregoing description, when read in conjunction with the accompanying drawings. However, any and all modifications of the teachings of this disclosure will still fall within the scope of the non-limiting embodiments of this invention.

Although described in the context of particular embodiments, it will be apparent to those skilled in the art that a number of modifications and various changes to these teachings may occur. Thus, while the invention has been particularly shown and described with respect to one or more embodiments thereof, it will be understood by those skilled in the art that certain modifications or changes may be made therein without departing from the scope of the invention as set forth above, or from the scope of the claims to follow.

What is claimed is:

1. A memory device comprising:
   a first plurality of semiconductor nanowires tethered between first and second landing pads and suspended over a substrate;
   a first gate electrode extending across said first plurality of semiconductor nanowires, each of said first plurality of semiconductor nanowires being surrounded by said first gate electrode, said semiconductor nanowires of said first plurality thereby being gate-all-around (GAA) semiconductor nanowires;
   a first, a second, and a third field effect transistor (FET), each formed, with said first gate electrode, by at least one of said first plurality of semiconductor nanowires, said first, second, and third FETs each having a source/drain contact;
   a second plurality of semiconductor nanowires tethered between third and fourth landing pads and suspended over said substrate;
   a second gate electrode extending across said second plurality of semiconductor nanowires, each of said second plurality of semiconductor nanowires being surrounded by said second gate electrode, said semiconductor nanowires of said second plurality thereby being GAA semiconductor nanowires;
   a fourth, a fifth, and a sixth FET, each formed, with said second gate electrode, by at least one of said second plurality of semiconductor nanowires, said fourth, fifth, and sixth FETs each having a source/drain contact;
   said first gate electrode being aligned with and cross-coupled to a one of said third and fourth landing pads of said second plurality of semiconductor nanowires, and said second gate electrode being aligned with and cross-coupled to a one of said first and second landing pads of said first plurality of semiconductor nanowires, said first and second gate electrodes each having a gate contact,
   wherein each of said source/drain contacts is elevated over said landing pads and said gate electrodes relative to said substrate, and each of said gate contacts are elevated over said source/drain contacts relative to said substrate, and
   wherein said source/drain contact of said first FET is connected to a bitline connection; said source/drain contacts of said second and fifth FETs are each connected to ground connections; said source/drain contacts of said third and fourth FETs are each connected to operating voltage connections; said source/drain contact of said sixth FET is connected to a bitline bar connection; and said gate contacts of said first and second gate electrodes are connected to a word line connection.

2. The memory device as claimed in claim 1, wherein said first and second pluralities of semiconductor nanowires are silicon nanowires.

3. The memory device as claimed in claim 1, wherein said first FET is an n-type FET (nFET), said second FET is an nFET, said third FET is a p-type FET (pFET), said fourth FET is a pFET, said fifth FET is an nFET, and said sixth FET is an nFET.

4. The memory device as claimed in claim 1, wherein said first FET is a pass-gate (PG) transistor, said second FET is a pull-down (PD) transistor, said third FET is a pull-up (PU) transistor, said fourth FET is a PU transistor, said fifth FET is a PD transistor, and said sixth FET is a PG transistor.

5. The memory device as claimed in claim 1, wherein said first FET is formed by more than one of said first plurality of semiconductor nanowires.

6. The memory device as claimed in claim 1, wherein said second FET is formed by more than one of said first plurality of semiconductor nanowires.

7. The memory device as claimed in claim 1, wherein said third FET is formed by more than one of said first plurality of semiconductor nanowires.

8. The memory device as claimed in claim 1, wherein said fourth FET is formed by more than one of said second plurality of semiconductor nanowires.

9. The memory device as claimed in claim 1, wherein said fifth FET is formed by more than one of said second plurality of semiconductor nanowires.

10. The memory device as claimed in claim 1, wherein said sixth FET is formed by more than one of said second plurality of semiconductor nanowires.

11. The memory device as claimed in claim 1, wherein said first, third, fourth, and sixth FETs are each fowled by one semiconductor nanowire, and said second and fifth FETs are each formed by two semiconductor nanowires.

12. The memory device as claimed in claim 1, wherein said third and fourth FETs are each formed by one semiconductor nanowire, and said first, second, fifth, and sixth FETs are each formed by two semiconductor nanowires.

13. The memory device as claimed in claim 1, wherein said source/drain contacts of said first, second, third, fourth, fifth, and sixth FETs extend to a first plane separated from said landing pads and said first and second gate electrodes, so that said bit line connection, said ground connections, said operating voltage connections, and said bitline bar connection are made in said first plane.

14. The memory device as claimed in claim 13, wherein said gate contacts of said first and second gate electrodes extend to a second plane separated from said landing pads and said first and second gate electrodes and from said first plane, so that said word line connection is made in said second plane.

* * * * *